United States Patent [19]

Barlett et al.

[11] 4,355,457
[45] Oct. 26, 1982

[54] METHOD OF FORMING A MESA IN A SEMICONDUCTOR DEVICE WITH SUBSEQUENT SEPARATION INTO INDIVIDUAL DEVICES

[75] Inventors: Salvadore P. Barlett, Hazleton; Daniel J. Dougherty, Exeter; Frederick P. Lokuta, Dupont, all of Pa.

[73] Assignee: RCA Corporation, New York, N.Y.

[21] Appl. No.: 201,826

[22] Filed: Oct. 29, 1980

[51] Int. Cl.³ ............................................. H01L 21/78
[52] U.S. Cl. ....................................... 29/583; 29/578; 29/580; 29/413; 29/414; 156/644; 156/645; 156/649; 225/2; 225/96.5
[58] Field of Search .................. 29/578, 580, 583, 413, 29/414; 225/2, 96.5, 103; 156/644, 645, 649

[56] References Cited

U.S. PATENT DOCUMENTS

| | | | |
|---|---|---|---|
| 2,911,773 | 11/1959 | Gobat | 51/283 |
| 3,081,586 | 3/1963 | Gersbach | 51/283 |
| 3,852,876 | 12/1974 | Sheldon et al. | 29/580 X |
| 3,970,819 | 7/1976 | Gates et al. | 219/121 LM |
| 3,991,296 | 11/1976 | Kojima et al. | 219/121 L |
| 4,019,248 | 4/1977 | Black | 29/583 |
| 4,135,291 | 1/1979 | Tursky et al. | 29/580 X |
| 4,217,689 | 8/1980 | Fujii et al. | 29/583 |
| 4,237,601 | 12/1980 | Woolhouse et al. | 29/583 |

FOREIGN PATENT DOCUMENTS 2009499 6/1979 United Kingdom .

OTHER PUBLICATIONS

Garcia, J. R., "Electrical Isolation of Semiconductor Chip Edges", I.B.M. Tech. Discl. Bull., vol. 8, No. 5, Oct. 1965, p. 800–801.

Primary Examiner—L. Dewayne Rutledge
Assistant Examiner—W. G. Saba
Attorney, Agent, or Firm—Birgit E. Morris; Donald S. Cohen; Robert P. Seitter

[57] ABSTRACT

A method of forming a mesa in a semiconductor device comprises forming a plurality of such devices on a wafer, mechanically cutting relatively wide channels to a predetermined depth in said wafer at positions around individual ones of the devices to partially separate the devices from each other. The mechanical cutting technique defines mesa walls and plain surfaces between individual devices. These channels are then etched to repair scars caused by the cutting technique and, thereafter, the wafer is broken along the center line of the channels to separate the devices from each other.

6 Claims, 6 Drawing Figures

METHOD OF FORMING A MESA IN A SEMICONDUCTOR DEVICE WITH SUBSEQUENT SEPARATION INTO INDIVIDUAL DEVICES

BACKGROUND OF THE INVENTION

This invention relates to a method of forming mesas in semiconductor devices and more particularly to such a method utilizing primarily non-chemical techniques.

High voltage semiconductor devices are generally formed with mesas to shape and reduce the magnitude of the electric field at the side surface of the device. By reducing and shaping the field at the side surface the device can withstand higher reverse voltages before breakdown.

These mesas are generally formed by a chemical etching process in which an etchant, usually an acid, chemically reacts with the semiconductor material to remove such material and form the mesa. Use of a chemical etching process to form mesas has not been entirely satisfactory. First, the cost of the chemical etchants makes the use of such a process relatively expensive. Second, semiconductor devices including chemically etched mesas can exhibit excessive collector-base current leakage. This results from the fact that such processes involve the use of a mask on the surfaces of the device which are not etched and which thus must be protected from the etchant. As the mesa surface is etched the mask lying on the upper protected surface overhangs the surface being etched and can bend over into contact with that surface. In this event, the material in contact with the bent over mask portion is no longer etched while the surface below it is etched. Thus the upper edge of the mesa wall can overhang the lower portion. In some devices, then, the base can overlie the collector giving rise to the high leakage currents.

SUMMARY OF THE INVENTION

This invention provides a relatively economical method for forming mesas in a semiconductor device while minimizing the possibility of forming an overhanging base in the mesa surface. The method comprises forming a plurality of semiconductor devices, each having at least one PN junction on a wafer and then mechanically cutting first and second sets of relatively wide generally U-shaped channels in said wafer so that the semiconductor devices are partially separated from each other. The channels are formed with a bottom generally planar surface located below the PN junction and with a pair of generally planar mesa surfaces at which the junction terminates. Thereafter, the channels are etched for a very short time in a dilute etchant to smooth the channel surfaces and repair any damage done during the cutting and to provide a slightly arcuate contour to the parallel mesa walls. The devices are now separated from each other by scribing and breaking the wafer along the midline of the channels.

Preferably, the cutting is done by mechanical means such as a diamond blade saw or by a slightly defocused laser beam.

BRIEF DESCRIPTION OF THE DRAWING

For a better understanding of the invention, reference is made to the following description of a preferred embodiment thereof taken in conjunction with the figures of the accompanying drawing, in which.

DETAILED DESCRIPTION OF A PREFERRED METHOD

Figure 1:
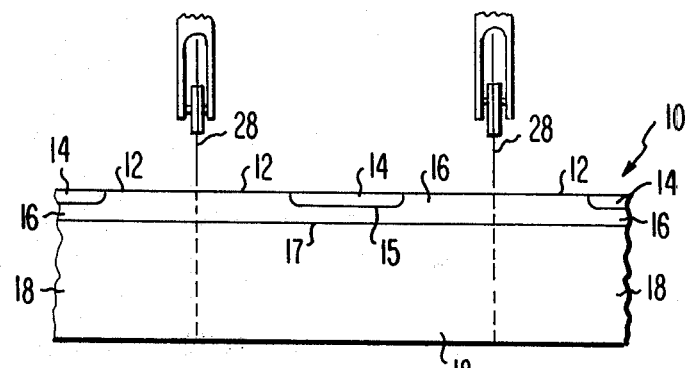
FIGS. 1-4 are a schematic illustration of a method of making a mesa in accordance with this invention.
Figure 2:
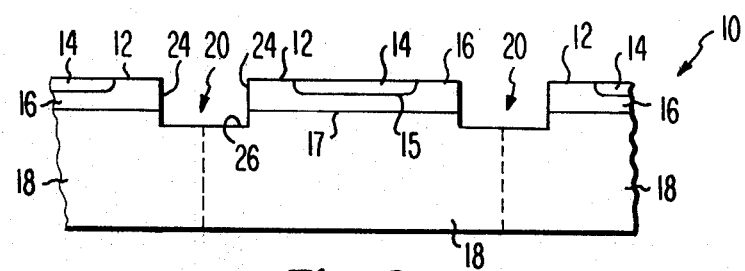

Referring to FIGS. 1-4 of the drawing, there is illustrated a portion of a wafer 10 in which there has been formed, by any generally conventional technique, a plurality of semiconductor devices 12 which are to be formed with a mesa. The semiconductor devices 12 can be of any type. For purposes of explaining a preferred embodiment of the invention each device 12 is a high voltage NPN transistor including an N type emitter 14, a P type base 16 and an N type collector 18. Thus, there is formed an emitter-base junction 15 and a base-collector junction 17. The base-collector junction 17 is to terminate in a mesa wall to minimize the field at the surface of the wall and assure that the device has a relatively high breakdown voltage. In FIGS. 1-4 of the drawing, dotted lines are utilized to denote the boundaries between individual semiconductor devices 12 and, as should be understood, to define the location at which the wafer is to be broken to separate individual devices from each other. The devices are preferably solder dipped at this point to provide the emitter, base and collector terminals used to make contact in an electric field. These terminals are not illustrated in the drawing for the sake of clarity. It should be understood, however, that the terminals can be provided at a later point in the manufacturing process, for example, after the devices have been fully formed and separated from the wafer.

Figure 6:
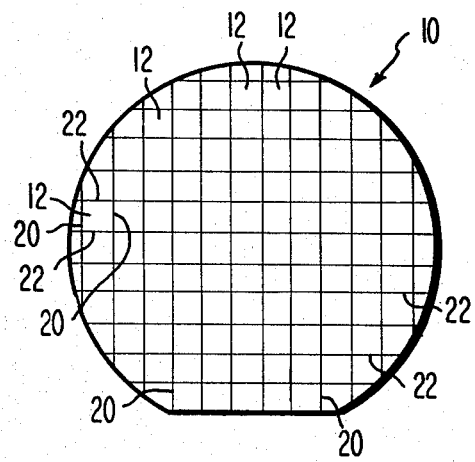

To form the mesa, a first set of parallel channels 20 are mechanically cut partially through the wafer on opposite sides of each device and a second set of such channels 22 are cut at right angles to the first set on the other pair of opposite sides of each device. Both the first and second sets of channels, 20 and 22 respectively, are illustrated in FIG. 6 of the drawing. Only the first set of channels 20 can be seen in FIGS. 1-4. As can be realized, each semiconductor device 12 is partially separated from its adjacent devices by the channels 20 and 22.

Referring back to FIGS. 1-4, each of the channels 20 and 22 are the same and each is generally U-shaped in cross-section including a pair of generally parallel mesa walls 24, 24 connected by a relatively flat bottom plain surface 26. The width of each channel, that is, the distance between mesa walls 24, 24 is relatively wide being on the order of about 5 to 10 mils and the depth, that is, the distance from the top major surface (the surface including the emitter 14 and base 16) to the bottom plain surface 26 is such that the bottom plain surface is located below, as viewed in the drawing, the base-collector PN junction 17. Typically, the depth of the channel is on the order of about 3 mils and the base-collector PN junction 17 is located at a depth of about 2 mils. The mesa walls 24, 24 generally define the mesa wall to be formed around adjacent semiconductor devices 12 on the wafer and the bottom surface 26 defines the plain around the mesas.

As noted, the channels 20 and 22 are mechanically cut. The preferred technique for mechanically cutting the channels is to utilize a diamond saw blade 28 having a thickness corresponding to the desired width of the channels to be formed. Of course, the blade should have a radial exposure sufficient to form the channels with the desired depth. In making the cut, the midpoint of the blade is centered over the boundaries between adjacent semiconductor devices 12. This can best be seen in FIG. 1 of the drawing where the saw blade 28 is aligned with the dotted lines denoting the boundaries between semiconductor devices. In this way, the bottom plain surface 26 formed by the saw blade extends equal distances from the boundary into the adjacent semiconductor devices 12.

It should be understood that other mechanical cutting means can be utilized to cut the channels. For example, another usable cutting technique would be to cut the channels with a laser device wherein the laser beam is slightly defocused to define the relatively large channel width.

Figure 3:
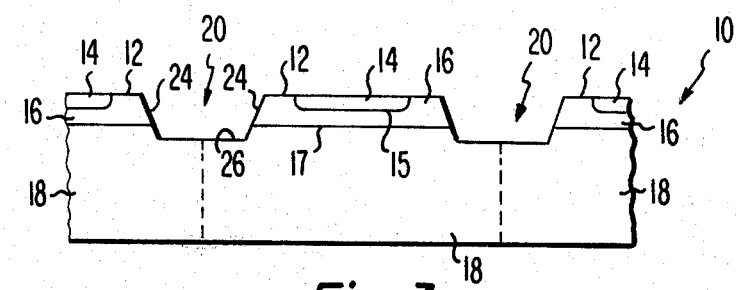
Figure 4:
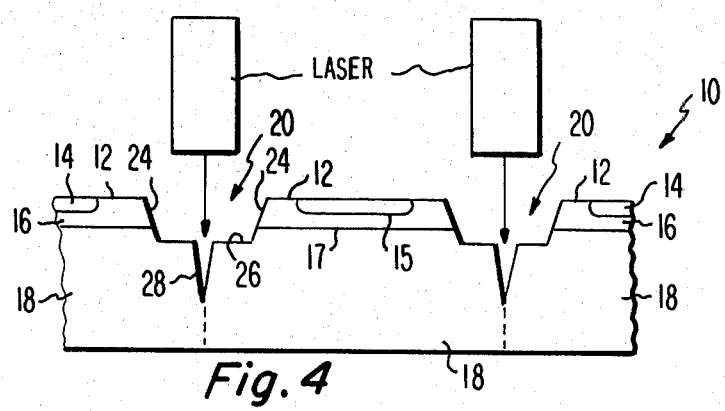
Figure 5:
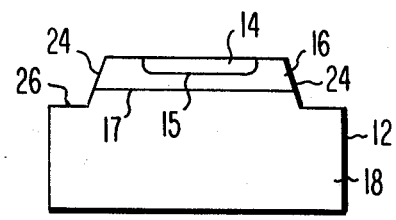
FIG. 5 is a side elevation view of a semiconductor device made in accordance with this invention; and, FIG. 6 is a plan view of a wafer being processed in accordance with this invention after the mesa walls have been cut.

After the channels are formed, the wafer is masked in accordance with generally conventional photolithographic techniques to protect the major surfaces and to leave the channels unprotected so that they can be lightly etched. Etching the channels repairs the damage, marring and scarring, done to the mesa walls 24, 24 and the bottom plain surface 26 by the saw or the laser. Etching also forms the walls 24, 24 so as to have a slightly arcuate surface as illustrated in FIG. 3 of the drawing. This etching process can be accomplished in a dilute solution of boiling sodium hydroxide (NaOH). A suitable solution would comprise $7\frac{1}{2}\%$ sodium hydroxide by volume. The wafers are placed in the solution for about 90 seconds. Thereafter, the wafer is rinsed in deionized water to remove any sodium (Na) ions in the channels and is then freon dried. This light etch does not etch away enough of the walls 24 to allow the mask to overlie the junction 17. It should be understood that the shape of the walls illustrated in FIGS. 3-5 is highly exaggerated for the sake of clarity.

At this point, the channels could be filled with a passivating material such as SiPOS (oxygen doped polysystalline silicon) or glass to protect the base-collector PN junctions 17 from surface electrons in the packaging material. In most cases, however, such passivation is not deemed necessary. Whether or not the channels are passivated, the plain surface 26 is scribed along its midpoint with a focussed laser beam to form grooves 28 extending partially into the wafer at the midpoint of the channels, that is, at the boundaries between the devices 12. Thus, the grooves are illustrated in FIG. 4 of the drawing as extending along the dotted lines denoting the boundaries between individual semiconductor devices 12. After the grooves have been scribed, any conventional technique can be utilized to break the wafer and separate the devices 12 from each other along these grooves. Once separated, it can be seen that the mesa is fully formed on the semiconductor device as illustrated in FIG. 5 of the drawing. If the terminals have not been previously formed on the device, the devices can be solder dipped to provide the terminals. Finally, the devices are packaged in accordance with any generally conventional technique.

From the preceding, it can be seen that there is provided a relatively inexpensive method for forming mesas by mechanical means. Moreover, since the mesas have been etched in a dilute solution for only a brief time, the tendency for the photoresist masking materials utilized in conventional channel etching techniques to overlie the mesa wall being formed is minimized. Accordingly, the base-collector leakage problem is minimized.

While there has been described a preferred embodiment of the invention, it should be obvious to those skilled in the art that various changes can be made within the spirit of the invention as recited in the appended claims.

We claim:

1. A method of forming a mesa in a semiconductor device, said method comprising:

forming a plurality of semiconductor devices each having at least one PN junction on a wafer;

mechanically cutting a first set of relatively wide generally U-shaped channels extending in a first direction on opposite sides of each of said devices and cutting a second set of relatively wide generally U-shaped channels extending in a second direction generally perpendicular to the first direction on opposite other sides of each of said devices, said channels having a bottom generally planar surface located below said PN junction and a pair of generally planar mesa walls at which said junctions terminate;

etching said channels for a short time in a dilute etchant to smooth the channel surfaces and to provide a slight arcuate contour to each said mesa wall; and, separating said devices from each other by breaking the wafer along the midline of said channels.

2. A method in accordance with claim 1 including the step of scribing the bottom surfaces of each of said channels to define grooves extending along the midlines thereof after etching and then separating said devices along said grooves.

3. A method in accordance with claims 1 or 2 wherein said cutting is done by saw means.

4. A method in accordance with claims 1 or 2 wherein said channels are etched in a dilute solution of boiling sodium hydroxide (NaOH) for a period of about 90 seconds.

5. A method in accordance with claims 1 or 2 wherein said channels are passivated before separating the devices from each other.

6. A method in accordance with claims 1 or 2 wherein said wafer is solder dipped to form terminals thereon before said channels are formed.

* * * * *

UNITED STATES PATENT AND TRADEMARK OFFICE
CERTIFICATE OF CORRECTION

PATENT NO. : 4,355,457

DATED : October 26, 1982

INVENTOR(S) : Salvadore Philip Barlett et al.

It is certified that error appears in the above-identified patent and that said Letters Patent is hereby corrected as shown below:

Column 2, line 32: "field" should be --circuit--.

Signed and Sealed this

Eleventh Day of January 1983

[SEAL]

Attest:

GERALD J. MOSSINGHOFF

Attesting Officer  Commissioner of Patents and Trademarks